(12) United States Patent
Kutaragi et al.

(10) Patent No.: US 6,229,751 B1
(45) Date of Patent: May 8, 2001

(54) ELECTRONIC DEVICES AND LOW-VOLTAGE DETECTION METHOD

(75) Inventors: Ken Kutaragi; Eiji Kawai, both of Tokyo (JP)

(73) Assignee: Sony Computer Entertainment, Inc. (JP)

( * ) Notice: Subject to any disclaimer, the term of this patent is extended or adjusted under 35 U.S.C. 154(b) by 0 days.

(21) Appl. No.: 09/443,623

(22) Filed: Nov. 19, 1999

(30) Foreign Application Priority Data

Nov. 20, 1998 (JP) .................................................. 10-331382
Oct. 21, 1999 (JP) .................................................. 11-299950

(51) Int. Cl.$^7$ ....................................................... G11C 7/00
(52) U.S. Cl. ...................... 365/229; 365/189.07; 365/207
(58) Field of Search .............................. 361/189.07, 229, 361/201, 207

(56) References Cited

U.S. PATENT DOCUMENTS

| | | | |
|---|---|---|---|
| 4,327,422 | * | 4/1982 | Imazeki et al. ...................... 365/229 |
| 4,399,524 | * | 8/1983 | Maguruma et al. .................. 365/229 |
| 4,422,163 | * | 12/1983 | Oldenkamp .......................... 365/229 |
| 4,631,724 | * | 12/1986 | Shimizu ............................... 365/201 |

* cited by examiner

Primary Examiner—Terrell W. Fears
(74) Attorney, Agent, or Firm—Lenner, David, Littenberg, Krumholz & Mentlik, LLP

(57) ABSTRACT

An electronic device that includes: a peripheral circuit which is driven by a drive voltage, a battery which supplies the drive voltage, a memory which is driven by the battery, and a CPU operable to write data to the memory, read the data which has been written, compare the written data with the read data, and determine whether or not the drive voltage has dropped below a minimum operable voltage based on the comparison.

24 Claims, 5 Drawing Sheets

101 LOW-VOLTAGE DETECTION CIRCUIT

1a ELECTRONIC DEVICE

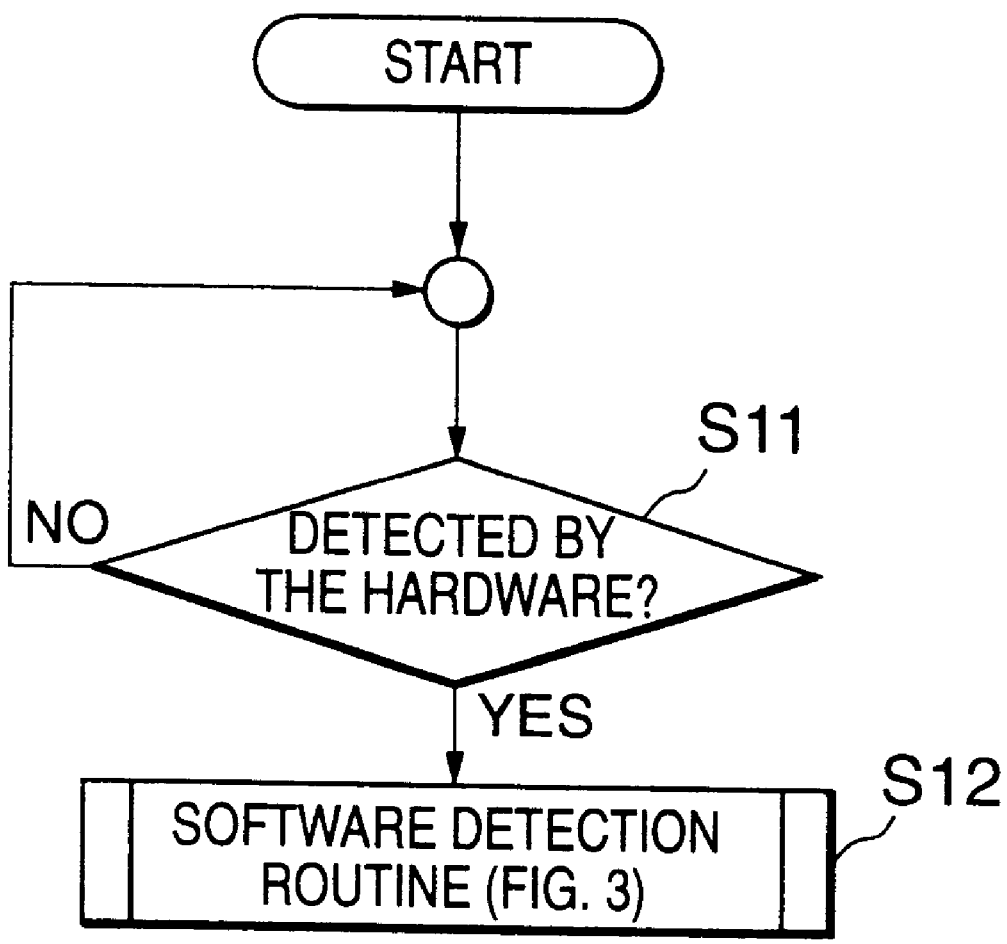

ELECTRONIC DEVICES AND LOW-VOLTAGE DETECTION METHOD

BACKGROUND OF THE INVENTION

1. Field of the Invention

The present invention relates to electronic devices equipped with electronic circuits that are driven by power supply means such as a battery, and a low-voltage detection method for detecting low voltage.

2. Description of Related Art

Portable electronic devices are well known. Many of these portable electronic devices are battery driven and driven by a primary or secondary battery. Some examples of these kinds of electronic devices are, portable game devices, portable audio devices and cellular telephones.

There are some battery driven electronic devices that have a mechanism for monitoring, displaying the amount of remaining charge of the battery. In these kinds battery such as electronic devices, there is a low-voltage detection circuit for monitoring the power-supply voltage supplied to the internal circuits.

FIG. 1 is a block diagram showing the configuration of a conventional low-voltage detection circuit. As shown in FIG. 1, the low-voltage detection circuit 101 is equipped with a BGR circuit 102 and a comparator 103.

The BGR circuit 102 is a constant-voltage output circuit called the "Band Gap Reference." The BGR circuit 102 outputs a predetermined absolute reference voltage Vref.

The comparator 103 compares the reference voltage Vref and the actual power-supply voltage Vlevel, and when the power-supply voltage Vlevel drops below the reference voltage Vref, it outputs a low-voltage detection signal Vdd_Low. The system uses this Vdd_Low signal as a trigger to perform necessary processing such as displaying "Battery End" or to save data for the application being executed.

However, there is error in the accuracy of the reference voltage output by the BGR circuit 102 and the threshold voltage of the comparator 103. Since electronic devices are designed for the worst-case condition which takes this error into consideration, "Battery End" is sometimes displayed for batteries that may still be used.

Moreover, the reference voltage Vref is generally determined to correspond to the lowest operable voltage for the internal circuits, however, the actual lowest operable voltage of the elements of the internal circuits, such as the semiconductors or the like, may vary depending on the manufacturing process or operating conditions. Therefore, depending on the variation of elements and operating conditions, "Battery End" was sometimes displayed for batteries that may still be used.

In other words, in conventional electronic devices, the effective battery capacity is not always completely used.

SUMMARY OF THE INVENTION

An object of the present invention is to provide an electronic device and low-voltage detection method which makes it possible to use battery capacity effectively.

The electronic device according to the present invention comprises an electronic circuit which is driven by a drive voltage supplied from a power-supply unit, a memory unit which is driven by the drive voltage, a comparison unit which writes data to the memory unit, after which it reads the data that have been written and compares the written data with the read data, and a judgment unit which judges whether or not the electronic circuit is operating properly based on the comparison results of the comparison unit.

The low-voltage detection method according to the present invention monitors the drive voltage that is supplied to an electronic circuit of an electronic device, comprises a comparison step wherein data are written to the memory unit that is driven by the drive voltage, thereafter the data that have been written are read and the written data are then compared with the read data, and includes a judgment step wherein the value of the drive voltage is judged based on the comparison results as to whether or not it has dropped below the minimum operable voltage value for the electronic circuit.

A second electronic device according to the present invention comprises a memory that is driven by voltage supplied from a battery, and a CPU that is driven by the voltage. The CPU performs a write test for the memory, and based on the results of this write test, judges whether or not the voltage has dropped below the minimum operable voltage.

Moreover, a second low-voltage detection method according to the present invention is a low-voltage detection method which monitors the voltage supplied to the electronic device, and it comprises a step that performs a write test for the memory that is driven by the voltage, and a judgment step that judges, based on the results of the write test, whether or not the voltage has dropped below the minimum operable voltage.

BRIEF DESCRIPTION OF THE DRAWINGS

FIG. 5 is a flowchart which shows a process flow for detecting the low voltage together with the low-voltage detection circuit of the present invention.

DESCRIPTION OF THE PREFERRED EMBODIMENTS

A first embodiment of the present invention is explained below.

Figure 2:
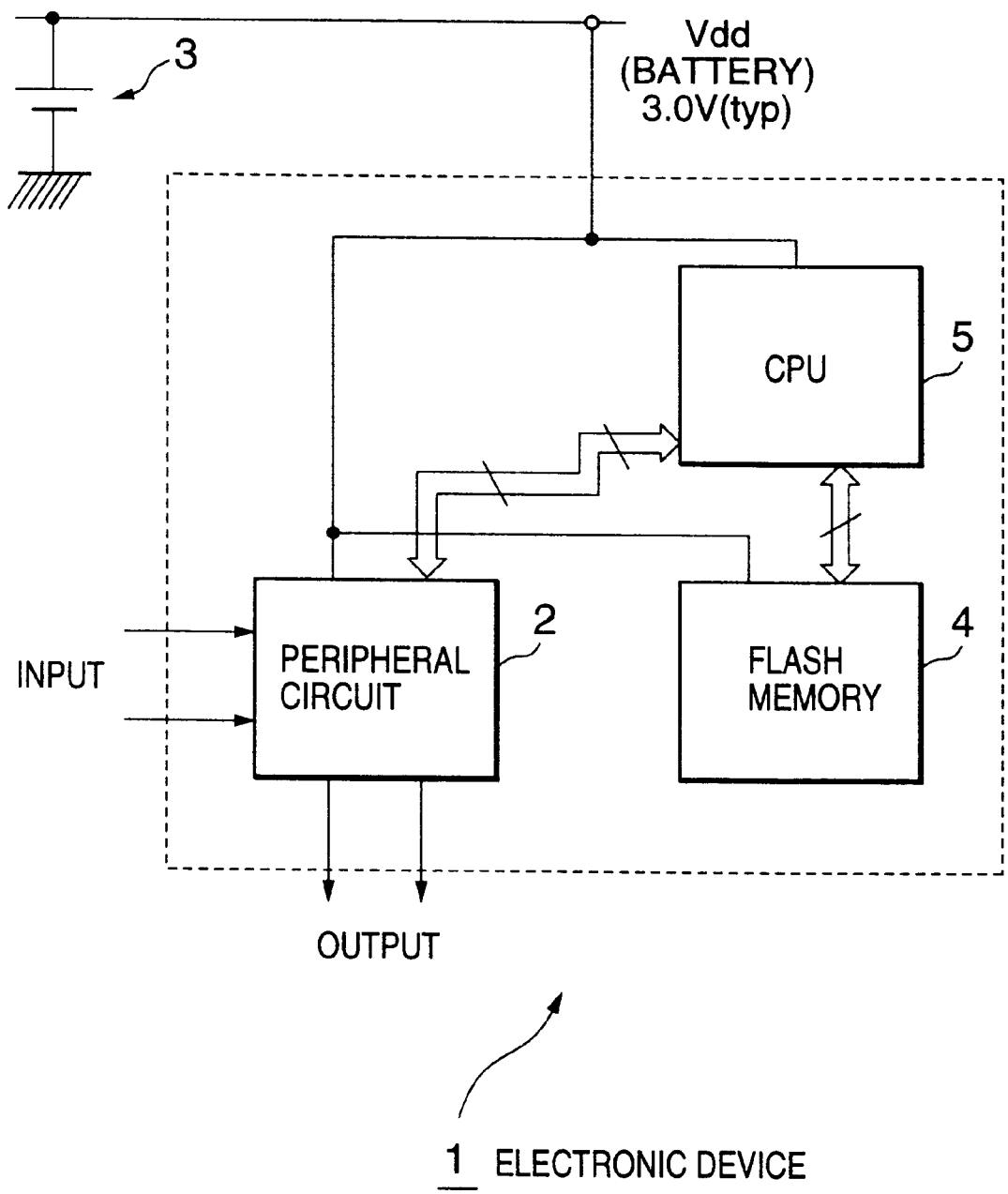
FIG. 2 is a block diagram which shows the configuration of an electronic device for which the present invention is applied.

FIG. 2 is a block diagram which shows the configuration of an electronic device for which the present invention is applied.

As shown in FIG. 2, the electronic device 1 comprises a peripheral circuit 2, battery 3, flash memory 4 and CPU 5. This electronic device 1 functions, for example, as a portable game device.

The electronic device 1 is constructed as a single-voltage drive system wherein the peripheral circuit 2, flash memory 4 and CPU 5 are driven by one battery 3. In this electronic device 1, the flash memory 4 and CPU 5 form a low-voltage detection system which monitors the value of the voltage output from the battery 3.

The peripheral circuit 2 is an electronic circuit such as an interface circuit which performs signal input or output between external devices. The peripheral circuit 2 is driven by the battery 3 (i.e., it obtains operating voltage from the battery 3). The minimum operable voltage of the peripheral circuit 2 is, for example, 2.0 V in this embodiment. The minimum operable voltage is the minimum voltage required for operating the peripheral circuit 2.

The battery 3 is the power-supply means which supplies drive voltage to each of the parts of the electronic device 1. The battery 3 can be, for example, a primary battery or secondary battery. In this embodiment, the output voltage of the battery 3 is nominally 3.0 V.

The flash memory 4 is driven by the battery 3 and is the storage means to and from which the CPU 5 writes or reads data. The flash memory 4 is a non-volatile memory. In this embodiment, the minimum operable voltage for the flash memory 4 is, for example, 2.4 V.

The CPU 5 is a central processing unit which controls the entire system. In this embodiment, the minimum operable voltage for the CPU 5 is, for example, 1.8 V.

As mentioned above, the standard (nominal) voltage of the battery 3 is 3.0 V, and the voltage drops according to the power consumption of the system. Moreover, the minimum operable voltage differs a little for each circuit block, namely, 1.8 V for the CPU 5, 2.0 V for the peripheral circuit 2 and 2.4 V for the flash memory. The reason that the minimum operable voltage for each circuit block is different is that the components, the operating speed, the circuit configuration and the like for each circuit block are different.

In this case, the minimum operable voltage of the flash memory 4 is larger than that of the other electronic circuits, namely, the minimum operable voltage of the peripheral circuit 2 and the CPU 5. Typically, the flash memory 4 requires a lot of power for writing (programming) data, so the minimum operable voltage is large.

If if the battery voltage is such that data can be properly written to the flash memory 4, then there is no problem with the operation of the other electronic circuits. This embodiment of the invention relys on the fact that the minimum operable voltage which enables writing to the flash memory 4 is the strictest condition. Thus, a write test of the flash memory 4 is performed and, based on the results of the write test, a judgement is made as to whether or not the voltage output from the battery 3 has dropped below a minimum operable voltage for the entire electronic device 1.

To that end, the CPU 5 includes a comparison function, whereby a comparison of write data and read data is performed. In particular, after the write data has been written to the flash memory 4, the written data is read out of the flash memory 4 as read data (or test data). The read data (test data) is then compared with the write data. The CPU 5 also includes a judgment function that, based on the comparison results, determines whether or not operation is proper. For example, these functions are implemented by having the CPU 5 execute certain software (program).

The CPU 5, by employing the comparison function, performs a matching test of the data that are written to and read from the flash memory 4. For example, the CPU 5 writes predetermined data (i.e., the write data) to a predetermined area of the flash memory 4, reads the data (i.e., the read or test data) from that area, and performs a data matching test on these data.

Based on the results of the data matching test, the CPU 5 determines whether or not the electronic device 1 can operate properly. In other words, based on the results of the data matching test, the CPU 5 determines whether or not the voltage output from the battery 3 has dropped below the minimum operable voltage for the electronic device 1. If the data do not match, then the CPU determines that the voltage output from the battery 3 has dropped below the reference minimum operable voltage of the flash memory 4, or in the case i.e., this embodiment, below 2.4 V.

The CPU 5 performs data matching at a set interval (for example, a 1 to 10 minute interval), and detects that the voltage output from the battery 3 has dropped below the minimum operable voltage.

The CPU 5 periodically writes the predetermined data to the predetermined area of the flash memory 4 and then immediately reads data from that area and performs the data matching test to determine whether or not the voltage output from the battery 3 has dropped below the real minimum operable voltage of an actual element under the operating conditions at that time.

The frequency of the test, the amount of data and the memory array area are selected according to the desired product performance for the system and the physical characteristics of the memory.

For example, it is possible to use a memory area that has been allocated for testing in advance as the area (address) in the flash memory 4 where the write data is to be written. Also, when the CPU 5 knows which areas in the flash memory 4 are not being used, it can select and use an arbitrary address from among the unused areas.

In addition, a predetermined data pattern can be used as the pattern for the data to be written. Moreover, when the CPU 5 includes a random number generator function, then data according to a random number produced by the random number generator function can be used as the data pattern.

It is also possible to change the address and/or data for each data matching test.

When the CPU 5 determines that the voltage output from the battery 3 has dropped below the minimum operable voltage, it performs necessary processes such as saving data or displaying "Battery End."

It is possible for each of the circuit blocks of the electronic device 1 to be implemented individually on a motherboard, or for all or part of them to be integrated onto one LSI (large scale integrated circuit).

Next, the process flow for performing the matching test of the flash memory 4 will be explained.

Figure 3:
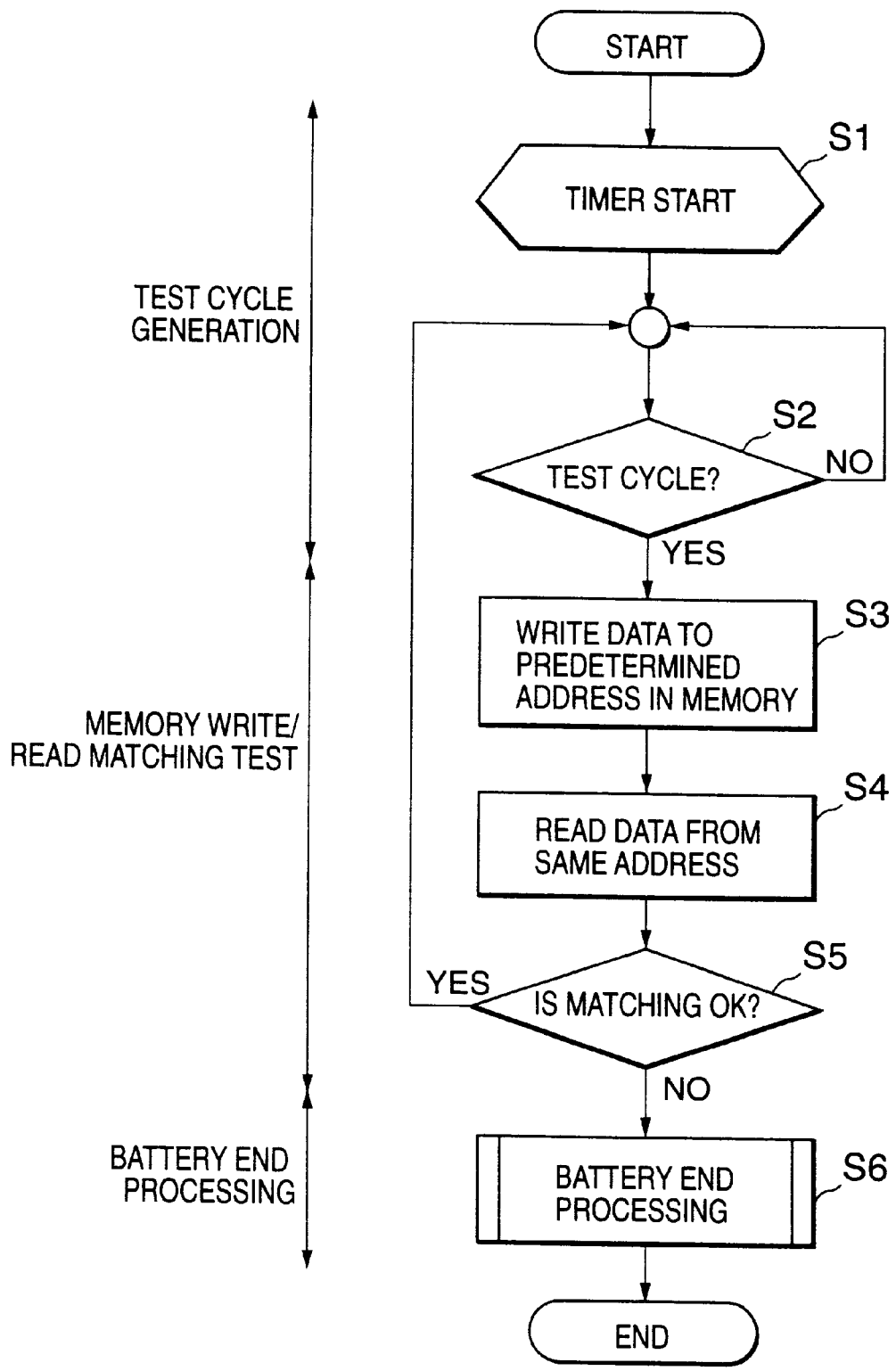
FIG. 3 is a flowchart which shows a process flow for detecting the minimum operable voltage by a data matching test of a flash memory in accordance with the invention.

FIG. 3 is a flowchart that shows the process flow for the matching test of the flash memory 4. The process can be divided into generation of the test cycle (step S1 to step S2), matching test by writing data to and reading data from the flash memory 4 (step S3 to step S5), and battery end processing (step 6).

First, in step S1, a CPU 5 starts the timer provided in the electronic device 1. With this timer, the CPU 5 performs the operations for step S2 (i.e., periodic test timing).

In step S2, a CPU 5 judges whether or not the current time corresponds with when a test cycle should be preformed. That is, the CPU 5 judges whether or not to perform the data matching test of the flash memory 4. This judgment may be performed based on a count value of the timer, or can be performed by using an interrupt from the timer. In step S2, if it is determined that the timing for a test is proper, the CPU 5 advances to step S3.

In step S3, the CPU 5 writes predetermined data to a predetermined address in the flash memory 4, then in step S4, the CPU 5 reads the data from the same address.

Next, in step S5, the CPU 5 judges whether or not the read data is equal to the data that had been written (the write data). If the CPU 5 determines that the data match, then the process flow returns to step S2. On the other hand, if it was determined that the data did not match, then the process flow advances to step S6. Before advancing to step S6, it is also possible to perform multiple data matching tests using other data and/or memory areas.

In step S6, the CPU 5 performs necessary processing such as saving data or displaying "Battery End."

By performing the above process, the electronic device 1 determines whether or not the voltage output from the battery 3 has dropped below the minimum operable voltage.

As explained above, by performing a write test (or data matching test) on the data in the flash memory 4, the electronic device 1 detects the actual minimum operable voltage. By doing so, the electronic device 1 can continue operating, depending on variations in element and operating conditions, until the voltage reaches the actual minimum operable voltage, and thus it is possible to effectively use the electric charge amount of the battery.

Moreover, in this embodiment, it is possible to monitor the output voltage of the battery 3 via the data matching test of the flash memory 4. Therefore, it not necessary to have dedicated hardware, namely a low-voltage detection circuit, for monitoring the output voltage of the battery 3, and it is possible to reduce overall power consumption.

A second embodiment of the present invention will now be explained. In this embodiment, the voltage of the power supply (e.g., the battery 3) is monitored by a low-voltage detection circuit. When the battery voltage drops to where it is near the minimum operable voltage, the power-supply (battery) voltage is then monitored via software.

Figure 4:
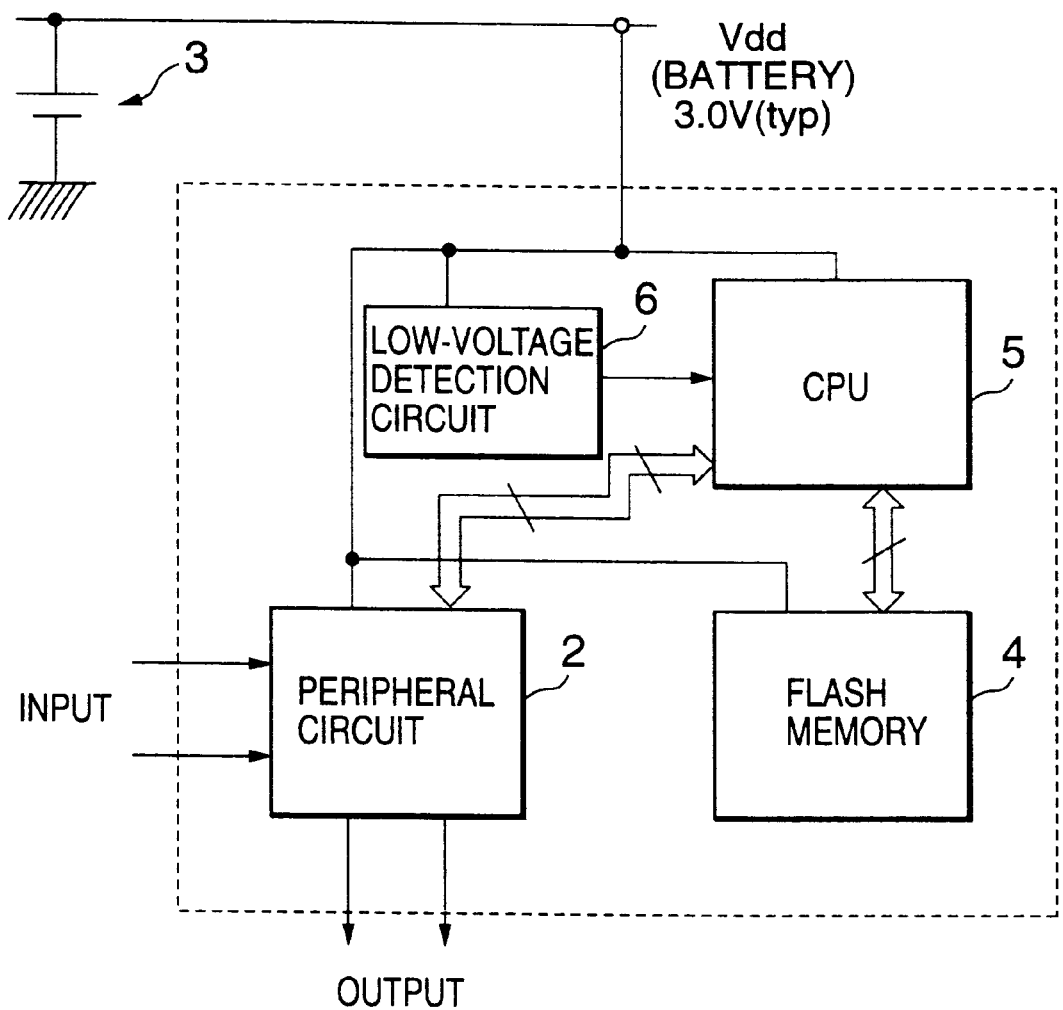
FIG. 4 is a block diagram which shows the configuration of another electronic device for which the present invention is applied.

FIG. 4 is a block diagram which shows the construction of a second electronic device 1a to which the present invention has been applied.

As shown in the figure, the electronic device 1a is constructed such that a low-voltage detection circuit 6 is added to the electronic device 1 shown in FIG. 2.

The electronic device 1a is constructed as a single-voltage drive system wherein the peripheral circuit 2, flash memory 4, CPU 5 and low-voltage detection circuit 6 are driven by one battery 3. In this electronic device 1a, the flash memory 4, CPU 5 and low-voltage detection circuit 6 form a low-voltage detection system which monitors the value of the voltage output from the battery 3.

Figure 1:
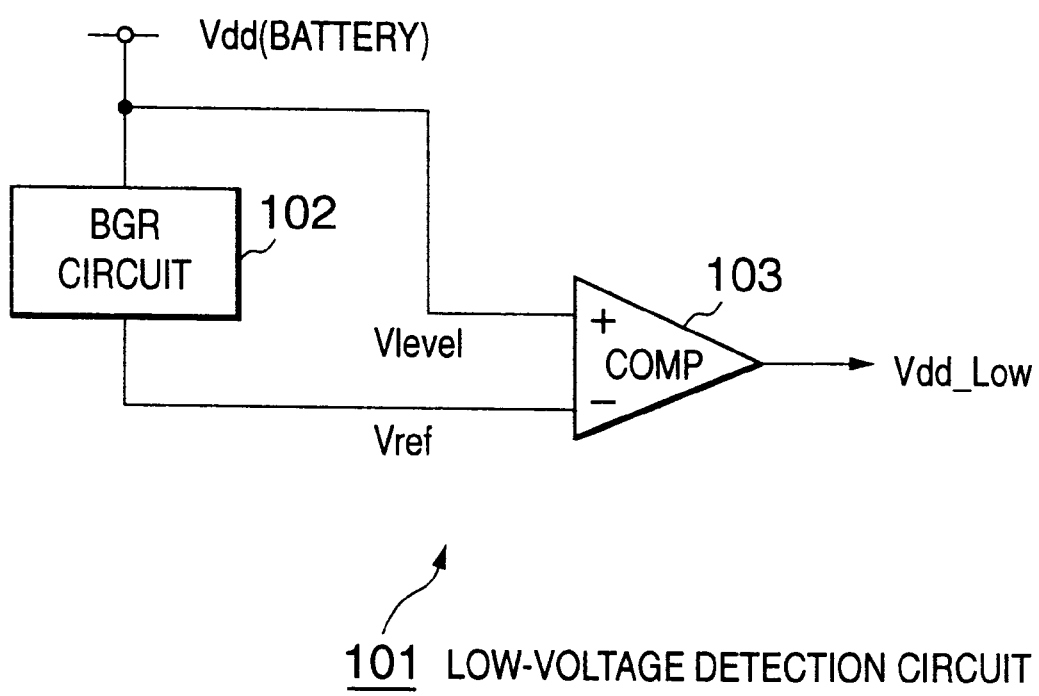
FIG. 1 is a block diagram which shows the configuration of a conventional low-voltage detection circuit that performs low-voltage detection.

The low-voltage detection circuit 6 is a low-voltage detection means that monitors the voltage output from the battery 3. For example, the low-voltage detection circuit 6 may be the same as the low-voltage detection circuit 101 shown in FIG. 1. Indeed, the low-voltage detection circuit 6 may comprise a BGR circuit 102 and comparator 103. In the low-voltage detection circuit 6, the reference voltage Vref that is output from the BGR circuit 102 is compared with the actual power-supply voltage Vlevel by the comparator 103. Detection of when the voltage of the battery 3 drops to a predetermined voltage is thus achieved.

The low-voltage detection circuit 6 outputs a detection trigger signal to the CPU 5 when the voltage output from the battery 3 reaches the predetermined voltage. More specifically, the low-voltage detection circuit 6 outputs a detection trigger signal when the output voltage drops to a value near the minimum operable voltage of 2.4 V of the flash memory 4 (for example, 2.5 V). When the CPU 5 detects the detection trigger signal from the low-voltage detection circuit 6, it engages the function for software monitoring of the minimum operable voltage. After software monitoring has begun, operation of the low-voltage detection circuit 6 may be stopped.

In effect, the CPU 5 monitors the voltage output from the battery 3 using hardware, namely the low-voltage detection circuit 6, until the voltage reaches the predetermined voltage. After the voltage has reached that value, the CPU 5 judges the minimum operable voltage with software in the same manner as was done in the first embodiment.

That is, the CPU 5 switches from hardware monitoring to software monitoring when the voltage output from the battery 3 is near to the minimum operable voltage of 2.4 V of the flash memory 4.

The process flow for detecting low battery voltage with the low-voltage detection circuit 6 will now be explained.

FIG. 5 is a flowchart which shows the process flow for detecting a low battery voltage with the low-voltage detection circuit 6.

As shown in FIG. 5, when the CPU 5 detects a low-voltage detection trigger signal from the low-voltage detection circuit 6 (step S11: Yes), the process flow branches to to the process for detecting the minimum operable voltage using the data matching test shown in FIG. 3 (step S12).

In this embodiment, the execution cycle of the data matching test can be constant or can be changed. For example, it is possible to shorten the execution cycle as time elapses. In this case, it is possible to determine the execution cycle based on the voltage-drop characteristics of the battery 3.

As described above, the electronic device 1a monitors the power-supply voltage of the battery 3 by both the low-voltage detection circuit 6 and matching test of the flash memory 4.

In this embodiment, as in the first embodiment, it is possible to effectively use the battery capacity.

The power-supply voltage of the battery 3 is monitored by using hardware, namely the low-voltage detection circuit 6, until the voltage is near the minimum operable voltage of the flash memory 4. Then the voltage is monitored with high precision by switching to software monitoring using the data matching test of the flash memory 4, thus making it possible to reduce the overhead of the software processing.

It is acceptable for the low-voltage detection circuit 6 used in this embodiment to be only capable of roughly detecting the voltage. Thus is possible to use a low-voltage detection circuit that is lower in cost than that used in a conventional device.

In the above embodiments of the invention, the peripheral circuit 2 was described to be an interface circuit that performs input or output of signals with an external device, however, it is not limited to this, and it can also be constructed as an electronic circuit having other functions.

Also, in the embodiments above, the flash memory 4 was used as the memory device, however, it is not limited to this, and it is possible to use other types of memories (for example, EEPROMs or FRAMs).

Moreover, the present invention can be applied not only to the voltage drop of a battery driven system, but can also be applied to voltage fluctuations in a system with an AC power supply.

The entire disclosure of Japanese Patent Application No. 10-331382, filed on Nov. 20, 1998 and Japanese Patent Application No. 11-299950, filed on Oct. 21, 1999, including specifications, claims, drawings and summaries thereof, are incorporated herein by reference in their entirety.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An electronic device, comprising:
    an electronic circuit which receives operating voltage from a power-supply;
    a memory which receives operating voltage from said power supply;
    a comparison unit operable to write predetermined data to said memory at a location, to read data from the location, and to compare the predetermined data with the read data to produce a comparison result; and
    a judgment unit operable to produce a determination result as to whether the operating voltage of said power-supply has reached or fallen below a minimum threshold based on the comparison result.

2. The electronic device of claim 1, wherein:
    a minimum operable voltage required for operating said memory is higher than a minimum operable voltage required for operating other electronic circuits which receive operating voltage from said power supply; and
    the minimum threshold is set to correspond with the minimum operable voltage for operating said memory.

3. The electronic device of claim 2, wherein said memory is a non-volatile memory.

4. The electronic device of claim 1, wherein said power-supply is a primary battery or a secondary battery.

5. The electronic device of claim 1, wherein said comparison unit produces the comparison result and said judgment unit produces the determination result at fixed time intervals.

6. The electronic device of claim 1, further comprising:
    a low-voltage detection circuit operable to monitor the operating voltage from said power-supply until the operating voltage drops to substantially the minimum operable voltage of said memory, at which time said comparison unit and said judgment unit operate to produce the comparison result and the determination result, respectively.

7. The electronic device of claim 6, wherein time intervals between when said comparison unit and said judgment unit operate to produce the comparison result and the determination result, respectively, become shorter as time elapses.

8. The electronic device of claim 7, wherein the time intervals are determined as a function of voltage drop characteristics of said power-supply.

9. A low-voltage detection method for monitoring an operating voltage supplied from a power-supply to an electronic device, comprising:
    writing predetermined data into a location of a memory, said memory receiving the operating voltage from said power-supply;
    reading test data from the location of said memory;
    comparing the predetermined data to the test data to produce a comparison result; and
    producing a determination result as to whether the operating voltage has dropped below a minimum threshold based on the comparison result.

10. The low-voltage detection method of claim 9, wherein said electronic device includes at least one electronic circuit, and a minimum operable voltage of said memory is higher than a minimum operable voltage of said electronic circuit.

11. The low-voltage detection method of claim 9, wherein said memory is a non-volatile memory.

12. The low-voltage detection method of claim 9, wherein said power-supply is a primary battery or a secondary battery.

13. The low-voltage detection method of claim 9, wherein the comparison
    result and the determination result are produced at fixed time intervals.

14. The low-voltage detection method of claim 9, further comprising: monitoring the operating voltage using a low-voltage detection circuit until the operating voltage drops to substantially a minimum operable voltage of said memory.

15. The low-voltage detection method of claim 14, wherein time intervals between the comparison result and the determination result, respectively, become shorter as time elapses.

16. The low-voltage detection method of claim 15, wherein the time intervals are determined as a function of voltage drop characteristics of said power-supply.

17. An electronic device, comprising:
    a memory which receives operating voltage from a battery; and
    a CPU operable to perform a data write and read test of said memory and, based on a result of the data write and read test, to determine whether the operating voltage has dropped below a minimum threshold.

18. A low-voltage detection method which monitors an operating voltage supplied to an electronic device, the method comprising:
    performing a data write and read test of a memory; and
    determining whether the operating voltage has dropped below a minimum threshold based on a result of the data write and read test.

19. The electronic device of claim 1, wherein the predetermined data include a data pattern, the data pattern being the same each time the comparison result and the determination result are produced.

20. The electronic device of claim 1, wherein the predetermined data include a data pattern, the data pattern potentially being different each time the comparison result and the determination result are produced.

21. The electronic device of claim 20, further comprising a random number generator operable to produce the predetermined data such that the data pattern is potentially different each time the comparison result and the determination result are produced.

22. The electronic device of claim 1, wherein the location in said memory is the same each time the comparison result and the determination result are produced.

23. The electronic device of claim 22, wherein the location in said memory is potentially different each time the comparison result and the determination result are produced.

24. The electronic device of claim 23, wherein the location in said memory is taken from any of a plurality of unused locations in said memory each time the comparison result and the determination result are produced.

* * * * *

UNITED STATES PATENT AND TRADEMARK OFFICE
CERTIFICATE OF CORRECTION

PATENT NO. : 6,229,751 B1  
DATED : May 8, 2001  
INVENTOR(S) : Kutaragi et al.

Page 1 of 1

It is certified that error appears in the above-identified patent and that said Letters Patent is hereby corrected as shown below:

Column 1,  
Line 13, change "driven and" to -- driven --.  
Line 14, change "driven" to -- such as --.  
Line 19, change "kinds battery such" to -- kinds of battery driven --.  
Line 20, delete "as".  
Line 21, delete "the".  
Line 22, after "circuits" insert -- of the electronic devices --.  
Line 51, change "was" to -- is --.

Column 3,  
Line 39, change "relys" to -- relies --.  
Line 44, change "minimum" to -- "minimum --.  
Line 45, change "voltage" to -- voltage" --.

Colum 4,  
Line 4, change "or" to -- i.e., --.  
Line 5, change "case i.e." to -- example for --.  
Line 51, change "the" (first occurrence) to -- a --.  
Line 55, change "the" to -- a --.  
Line 23, after "it" insert -- is --.

Column 6,  
Line 20, delete "to" (second occurrence).  
Line 44, after "Thus" insert -- , --.  
Line 65, change "are" to -- is --.

Signed and Sealed this

Twenty-second Day of January, 2002

*Attest:*

*Attesting Officer*

JAMES E. ROGAN  
*Director of the United States Patent and Trademark Office*